United States Patent

Kim et al.

[11] Patent Number: 6,015,748
[45] Date of Patent: Jan. 18, 2000

[54] METHODS OF FABRICATING INTEGRATED CIRCUIT MEMORY DEVICES INCLUDING SILICIDE BLOCKING LAYERS ON MEMORY CELL TRANSISTOR SOURCE AND DRAIN REGIONS

[75] Inventors: Hong-Ki Kim, Seoul; Duck-Hyung Lee, Kyungki-do; Chang-Sik Choi, Kyungki-do, all of Rep. of Korea

[73] Assignee: Samsung Electronics Co., Ltd., Rep. of Korea

[21] Appl. No.: 09/304,355

[22] Filed: May 4, 1999

[30] Foreign Application Priority Data

May 21, 1998 [KR] Rep. of Korea .................... 98-18369

[51] Int. Cl.⁷ .............................. H01L 21/3205
[52] U.S. Cl. ............................. 438/592; 438/589
[58] Field of Search ...................... 438/597, 586, 438/453, 664, 584

[56] References Cited

U.S. PATENT DOCUMENTS 5,589,423 10/1994 White et al. ...................... 438/586

*Primary Examiner*—Charles Bowers
*Assistant Examiner*—Craig Thompson
*Attorney, Agent, or Firm*—Myers Bigel Sibley & Sajovec

[57] ABSTRACT

Integrated circuit memory devices are fabricated by fabricating an array of memory cell field effect transistors and peripheral circuit field effect transistors that are spaced-apart from the memory cell transistors, in an integrated circuit substrate. The memory cell transistors include spaced-apart memory cell transistor source and drain regions and a memory cell gate therebetween. The peripheral circuit transistors include spaced-apart peripheral circuit transistor source and drain regions and a peripheral circuit gate therebetween. A silicide blocking layer is formed on the memory cell transistor source and drain regions. The integrated circuit substrate is silicided to thereby form a silicide layer on the memory cell transistor gates, on the peripheral circuit source and drain regions and on the peripheral circuit gates, such that the memory cell transistor source and drain regions are free of the silicide layer thereon. Accordingly, low contact resistance silicide regions may be selectively provided in memory cells without degrading the leakage characteristics thereof.

12 Claims, 3 Drawing Sheets

METHODS OF FABRICATING INTEGRATED CIRCUIT MEMORY DEVICES INCLUDING SILICIDE BLOCKING LAYERS ON MEMORY CELL TRANSISTOR SOURCE AND DRAIN REGIONS

FIELD OF THE INVENTION

This invention relates to integrated circuit devices and fabrication methods and more particularly to integrated circuit memory devices and methods of fabrication thereof.

BACKGROUND OF THE INVENTION

Integrated circuit devices, such as integrated circuit memory devices and integrated circuit logic devices, are widely used in consumer and commercial applications. Recently, Merged Memory and Logic (MML) integrated circuits have been developed. MML integrated circuits generally include a large capacity memory and a large logic block that are merged in one integrated circuit. Thus, an MML integrated circuit can replace discrete memory and logic chips that are used in personal computers and other consumer and commercial devices. MML devices are described, for example, in U.S. Pat. No. 5,848,016 to Kwak, entitled "Merged Memory and Logic (MML) Integrated Circuits and Methods Including Serial Data Path Comparing", and assigned to the assignee of the present application, the disclosure of which is hereby incorporated herein by reference.

It is known to use a silicide process to form low resistance contacts in integrated circuit memory devices including MML integrated circuit devices. In a silicide process, a refractory metal is reacted with exposed silicon areas thereunder to form a silicide. Following silicide formation, a selective etch may be used to remove the unreacted refractory metal without attacking the silicide. See for example U.S. Pat. No. 5,001,082 to Goodwin-Johannson entitled "Self-Aligned Salicide Process for Forming Semiconductor Devices and Devices Formed Thereby."

In manufacturing highly integrated memory devices including MML devices, it is known to form a silicide layer in the memory and in the logic block to reduce the contact resistance in both portions of the MML integrated circuit. It is also known that if the silicide layer is formed on the active region of the memory, junction leakage may increase which may thereby degrade the data storing ability of the memory. More specifically, in a Dynamic Random Access Memory (DRAM) device or an MML device that includes a DRAM, a silicide layer on the active region of the DRAM can increase the junction leakage of the memory cells, particularly where the storage node is formed. This leakage may degrade the data storing time of the capacitors of the DRAM which may increase the refresh requirements of the DRAM and/or decrease the reliability thereof.

In order to overcome this problem, it is known to form a silicide layer in the logic block of an MML integrated circuit but not in the memory block. It is also known to form a silicide layer in peripheral portions of an integrated circuit memory device but not in the memory cell array. Unfortunately, by not using silicide in the memory cell array, the contact resistance therein may increase.

SUMMARY OF THE INVENTION

It is therefore an object of the present invention to provide improved methods of fabricating integrated circuit memory devices including silicide layers, and memory devices so formed.

It is another object to provide improved fabrication methods for MML integrated circuit devices including silicide layers, and MML integrated circuit devices so formed.

It is yet another object of the present invention to provide methods of fabricating integrated circuit memory devices and MML devices that can provide low contact resistance and low leakage current in the memory portions thereof.

These and other objects are provided, according to the present invention, by forming a silicide blocking layer on memory cell transistor source and drain regions and siliciding the integrated circuit substrate to thereby form a silicide layer on the memory cell gates, on the peripheral circuit source and drain regions and on the peripheral circuit gates. The memory cell transistor source and drain regions are free of the silicide layer thereon. Accordingly, the memory cell transistor gates can have a silicide contact to thereby provide reduced contact resistance, whereas the memory cell source and drain regions can be free of a silicide contact to thereby reduce leakage current and allow reduction in the refresh rates and/or an increase in reliability.

More specifically, integrated circuit memory devices are fabricated by fabricating an array of memory cell field effect transistors and a plurality of peripheral circuit field effect transistors that are spaced-apart from the memory cell transistors, in an integrated circuit substrate. The memory cell transistors comprise spaced-apart memory cell transistor source and drain regions and a memory cell gate therebetween. The peripheral circuit transistors comprise spaced-apart peripheral circuit transistor source and drain regions and a peripheral circuit gate therebetween. A silicide blocking layer is formed on the memory cell transistor source and drain regions. The integrated circuit substrate is silicided to thereby form a silicide layer on the memory cell transistor gates, on the peripheral circuit source and drain regions and on the peripheral circuit gates, such that the memory cell transistor source and drain regions are free of the silicide layer thereon.

The silicide blocking layer may be formed by forming a blanket silicide blocking layer on the integrated circuit substrate including on the spaced-apart memory cell transistor source and drain regions, on the memory cell gates, on the spaced-apart peripheral circuit transistor source and drain regions and on the peripheral circuit gates. The blanket silicide blocking layer is etched on the memory cell gates, on the spaced-apart peripheral circuit transistor source and drain regions and on the peripheral circuit gates. Thus, the spaced-apart peripheral circuit transistor source and drain regions and the peripheral circuit gates are free of the silicide blocking layer.

In a preferred embodiment, the silicide blocking layer may comprise an insulating layer and an anti-reflective coating on the insulating layer. The insulating layer may comprise high temperature oxide and/or low temperature oxide.

In more detail, a blanket insulating layer is formed on the integrated circuit substrate including on the spaced-apart memory cell transistor source and drain regions, on the memory cell gates, on the spaced-apart peripheral circuit transistor source and drain regions and on the peripheral circuit gates. An antireflective coating is formed on the blanket insulating layer. A patterned photoresist layer is formed on the antireflective coating that exposes the antireflective coating on the memory cell gates, on the spaced-apart peripheral circuit transistor source and drain regions and on the peripheral circuit gates. Dry etching is performed on the blanket silicide blocking layer and a portion of the insulating layer on the memory cell gates, on the spaced-apart peripheral circuit transistor source and drain regions and on the peripheral circuit gates, using the patterned photoresist layer as an etch mask. Wet etching may then be performed on the remaining portion of the insulating layer on the memory cell gates, on the spaced-apart peripheral circuit transistor source and drain regions and on the peripheral circuit gates, using the patterned photoresist layer as an etch mask. The patterned photoresist layer may then be removed and the antireflective coating may then be removed.

Siliciding may be performed by blanket forming a refractory metal layer on the integrated circuit substrate including on the silicide blocking layer, on the memory cell transistor gates, on the peripheral circuit source and drain regions and on the peripheral circuit gates. Heating is then performed to react the refractory metal layer with the memory cell transistor gates, the peripheral circuit source and drain regions and the peripheral circuit gates to thereby form the silicide layer on the memory cell transistor gates, on the peripheral circuit source and drain regions and on the peripheral circuit gates. The refractory metal layer on the silicide blocking layer on the memory cell transistor source and drain regions remains unreacted. The unreacted refractory metal layer may then be removed.

In one embodiment of the present invention, the peripheral circuit transistors comprise a control circuit for the array of memory cell transistors. In another embodiment of the invention, the integrated circuit memory device is an MML integrated circuit device including the array of memory cell transistors and a logic block that communicates with the array of memory cell transistors. The peripheral circuit transistors comprise the logic block.

According to another aspect, the integrated circuit also includes a field effect transistor isolation region that isolates the memory cell field effect transistors from one another. A plurality of bit lines are included on the memory cell field effect transistor region. During silicidation, the bit lines are also silicided.

Integrated circuit memory devices according to the present invention include an array of memory cell field effect transistors and a plurality of peripheral circuit field effect transistors that are spaced-apart from the array of memory cell transistors, in an integrated circuit substrate. The memory cell transistors comprise spaced-apart memory cell transistor source and drain regions and a memory cell gate therebetween. The peripheral circuit transistors comprise spaced-apart peripheral circuit transistor source and drain regions and a peripheral circuit gate therebetween. A silicide layer is also included on the memory cell transistor gates, on the peripheral circuit source and drain regions and on the peripheral circuit gates. The memory cell transistor source and drain regions are free of the silicide layer thereon. A memory cell field effect transistor isolation region may also be included with a plurality of bit lines thereon. The silicide layer is also preferably on the plurality of bit lines. A silicide blocking layer may also be provided on the memory cell transistor source and drain regions. Accordingly, low contact resistance silicide regions may be selectively provided in memory cells without degrading the leakage characteristics thereof.

DETAILED DESCRIPTION OF PREFERRED EMBODIMENTS

Figure 1:
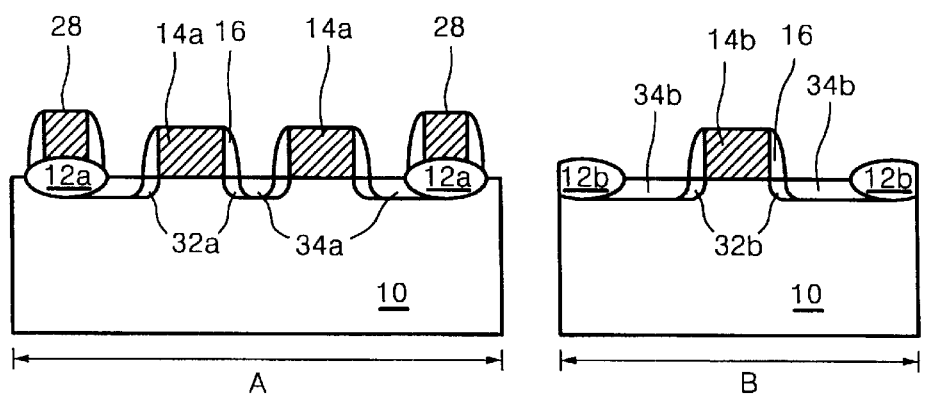
FIGS. 1–6 are cross-sectional views of integrated circuit memory devices according to the present invention during intermediate fabrication steps.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

According to the present invention, a silicide blocking layer may be formed on memory cell transistor source and drain regions so that these regions are not silicided. The gates of the memory cell transistors may be silicided to thereby provide low resistance contacts, whereas the unsilicided source and drain regions can provide low leakage contacts. Accordingly, the refresh characteristics of the memory cells need not degrade as a result of the silicide process.

FIGS. 1–6 are cross-sectional views of integrated circuit memory devices according to the present invention during intermediate fabrication steps. In FIGS. 1–6, the integrated circuit memory device includes an array of memory cell field effect transistors in a memory array portion A and a plurality of peripheral circuit field effect transistors in a peripheral circuit portion B. The memory cell field effect transistors may form a DRAM array. The peripheral circuit field effect transistors may comprise a control circuit for the array of memory cell transistors. Alternatively, the peripheral circuit transistors may comprise a logic block in an MML integrated circuit device. As shown in FIGS. 1–6, the peripheral circuit field effect transistors in the peripheral circuit portion B are laterally spaced-apart from the array of memory cell field effect transistors in the memory array portion A.

Referring now to FIG. 1, a field isolation layer is formed in an integrated circuit substrate such as a silicon substrate 10 using local oxidation, trench isolation or other conventional techniques. In the memory array portion A, the field isolation layer forms a memory cell field effect transistor isolation region 12a. In the peripheral circuit portion B, the field isolation layer forms a peripheral circuit field effect transistor isolation region 12b. A gate insulating layer such as a gate oxide is then formed on the surface of the integrated circuit substrate 10 using conventional techniques. The gate insulating layer may have a thickness in the range of about 300 Ångstroms to about 2000 Ångstroms and may be formed by thermal oxidation or other conventional processes. A plurality of gate electrodes comprising polysilicon are then formed on the substrate 10. The gate electrodes on the memory array portion A form a plurality of memory cell gates 14a. The gate electrodes on the memory cell isolation region 12a form a plurality of bit lines 28. The gate electrodes on the peripheral circuit portion B form peripheral circuit gates 14b.

Still referring to FIG. 1, lightly doped source/drain regions 32a and 32b are formed in the memory array portion A and peripheral circuit portion B, respectively, using the respective gates 14a and 14b and bit lines 28 as a mask. An insulating layer such as silicon dioxide and/or silicon nitride is then formed and etched to thereby form sidewall spacers 16 on the sidewalls of the gates 14a and 14b and bit lines 28 using conventional techniques. Heavily doped source/drain regions 34a and 34b are then formed on the memory cell portion A and the peripheral circuit portion B, respectively, using the sidewall spacers 16 as a mask. The lightly doped and heavily doped source/drain regions will be collectively referred to as "source and drain regions." The formation of lightly doped and heavily doped source/drain regions is well known to those having skill in the art and need not be described further herein.

Figure 2:
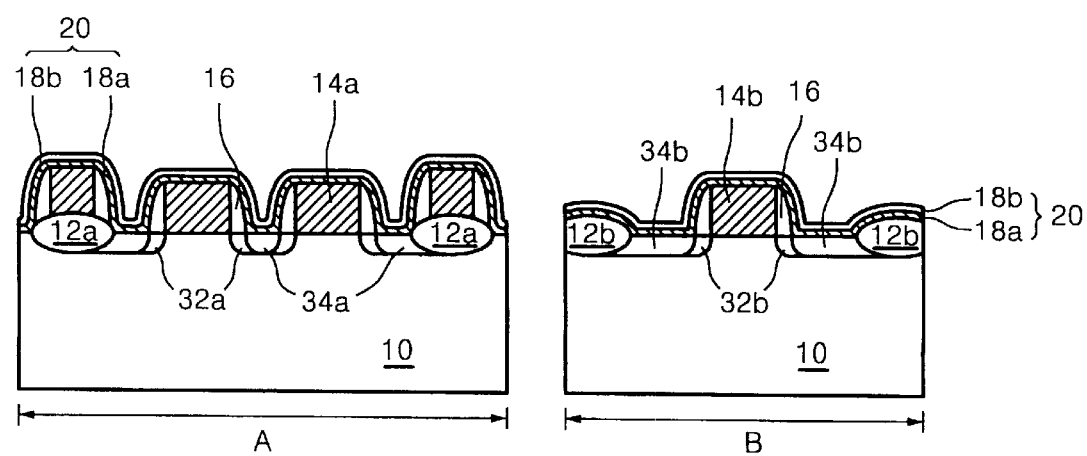

Referring now to FIG. 2, a blanket silicide blocking layer 20 is formed on the integrated circuit substrate including on the spaced-apart memory cell transistor source and drain regions 32a/34a, on the memory cell gates 14a, on the spaced-apart peripheral circuit transistor source and drain regions 32b/34b, on the peripheral circuit gates 14b and on the bit lines 28. More specifically, as shown in FIG. 2, the silicide blocking layer 20 comprises an insulating layer 18a and an antireflective coating 18b thereon. The insulating layer 18a may comprise medium temperature oxide and/or high temperature oxide. The antireflective coating 18b may comprise PE-SiON. As is well known to those of skill in the art, the antireflective layer 18b may be used to enhance the ability to form highly integrated patterns using photolithography.

The insulating layer 18a may have a thickness of between about 280 Ångstroms and about 320 Angstroms. Medium temperature oxide may be grown at temperature ranges between about 300° C. and about 600° C. High temperature oxide may be grown at temperatures above about 800° C. For reliability purposes, medium temperature oxide may be preferred for the insulating layer 18a. Moreover, a single silicide blocking layer 20 may be formed, without using an antireflective coating 18b.

Figure 3:
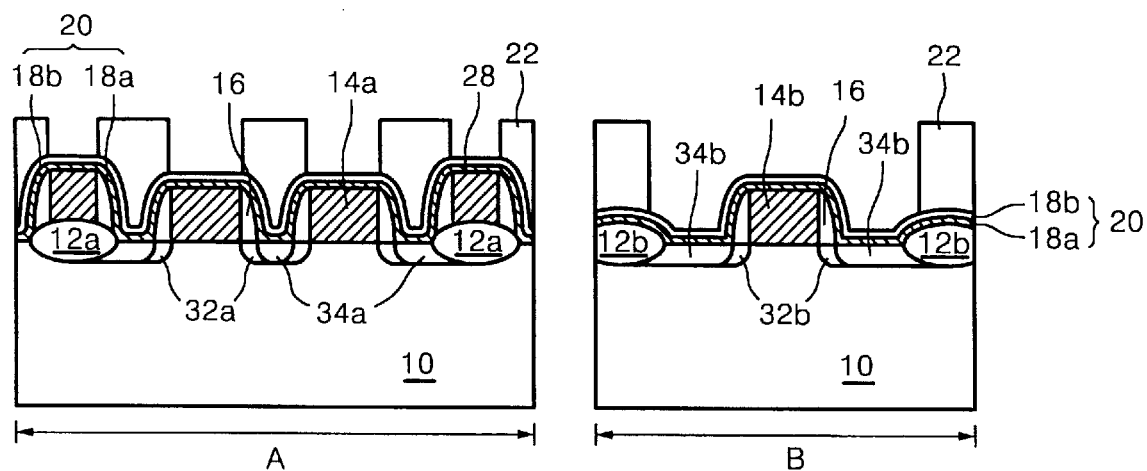

Referring now to FIG. 3, a photoresist layer 22 is blanket formed on the silicide blocking layer 20. The photoresist layer 20 may then be selectively etched to expose the antireflective coating 20 on the memory cell gates 14a, on the spaced-apart peripheral circuit transistor source and drain regions 32b/34b, on the peripheral circuit gates 14b and on the bit lines 28.

Figure 4:
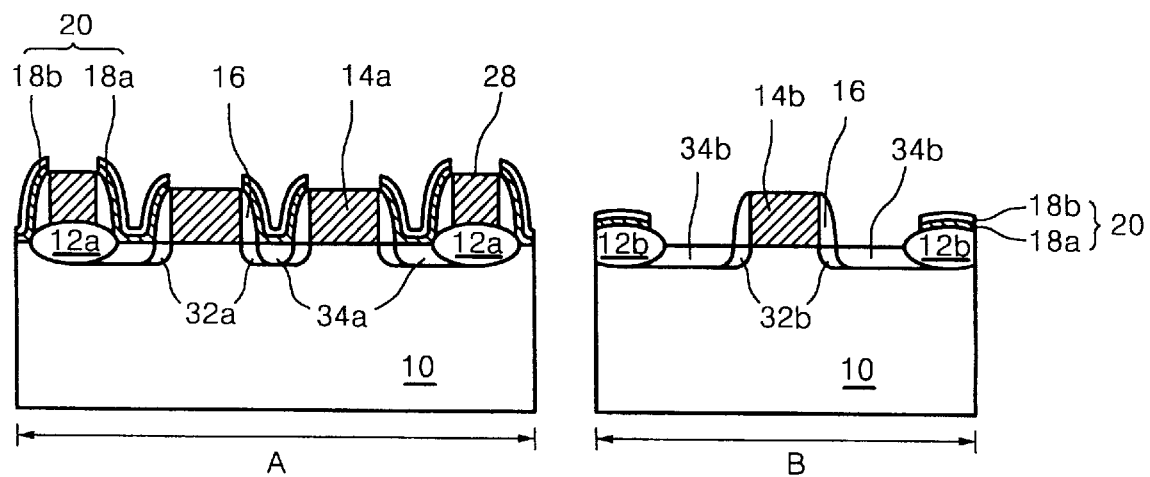

Then, referring to FIG. 4, the patterned photoresist layer 22 is used to selectively etch the exposed portions of the silicide blocking layer 20. The silicide blocking layer 20 may be etched using many conventional etching techniques. In a preferred embodiment, the antireflective layer 18b and a portion of the insulating layer 18a may be dry etched, for example using plasma etching, to remove the exposed antireflective layer 18b and to remove the exposed insulating layer 18a to a thickness of between about 30 Ångstroms and about 100 Ångstroms using the patterned photoresist layer 22 as a mask. Wet etching may then be used to remove the remaining exposed portion of the insulating layer 18. The two-step etching may reduce damage to the silicon substrate 10 and to the gates 14a and 14b that may be caused by plasma etching.

As shown in FIG. 4, the photoresist layer 22 is then removed, for example, by a conventional ashing and strip process. Accordingly, the memory cell transistor gates 14a, the bit lines 28, the peripheral circuit transistor gates 14b and the peripheral circuit source and drain regions 32b/34b are exposed.

Figure 5:
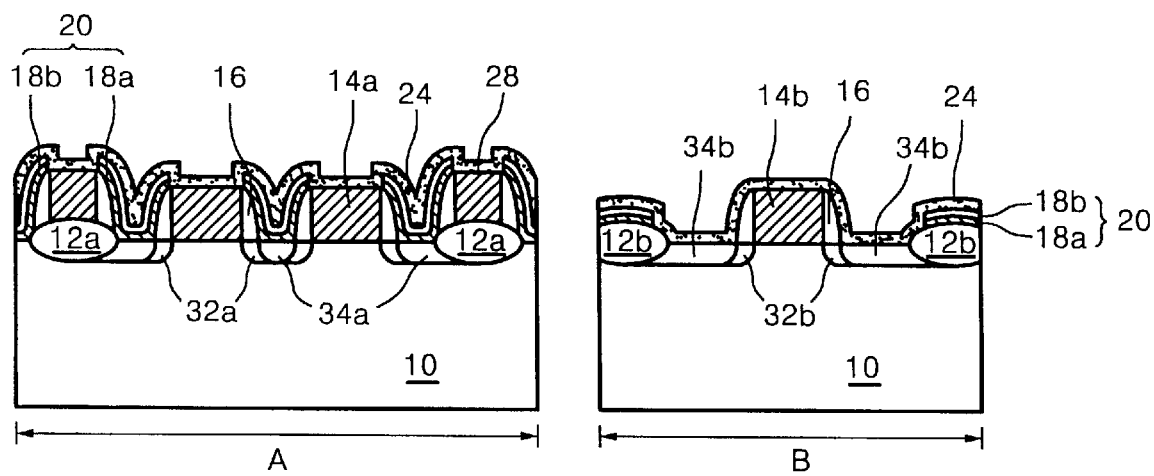

Referring now to FIG. 5, a refractory metal layer or layers 24 including for example cobalt, titanium and/or nickel, is blanket formed on the integrated circuit substrate 10 including on the silicide blocking layer 20, the memory cell transistor gates 14a, the peripheral circuit source and drain regions 32b/34b, the peripheral circuit gates 14b, and the bit lines 28. It also will be understood that the silicide layer may be formed on the bit lines in a separate silicide step.

Figure 6:
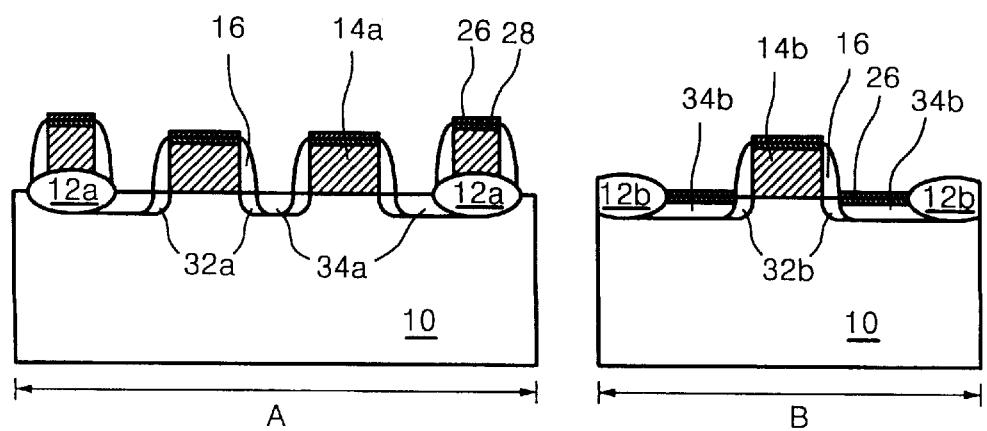

Finally, referring to FIG. 6, the integrated circuit substrate is silicided by reacting the silicon and/or polysilicon and the refractory metal layer 24 to thereby form a low resistance refractory metal silicide layer 26 such as titanium silicide, cobalt silicide and/or nickel silicide on the memory cell transistor gates 14a, on the peripheral circuit source and drain regions 32b/34b, on the peripheral circuit gates 14b and on the bit lines 28. As shown in FIG. 6, the memory cell transistor source and drain regions 32a/34a are free of the silicide layer 26 thereon. As also shown on FIG. 6, the silicide layer 26 also does not form on the sidewall spacers 16. The unreacted refractory metal may then be removed for example using sulfuric acid. An optional second heating step may be performed and the silicide blocking layer 20 may then be removed. It will also be understood that the antiflective layer 18b may be removed in a wet etch using hydrofluoric acid or other known etchants. Then, the refractory metal layer 24 may be formed directly on the insulating layer 18a.

Referring again to FIG. 6, integrated circuit memory devices according to the present invention include an array of memory cell field effect transistors and a plurality of circuit field effect transistors that are spaced-apart from the array of memory cell transistors in respective memory array portion A and peripheral circuit portion B of an integrated circuit substrate 10. The memory cell transistors comprise spaced-apart memory cell transistor source and drain regions 32a/34a and a memory cell gate 14a therebetween. The peripheral circuit transistors comprise spaced-apart peripheral circuit transistor source and drain regions 32b/34b and a peripheral circuit gate 14b therebetween. A memory cell field effect transistor isolation region 12a is also included that isolates the memory cell field effect transistors from one another. A plurality of bit lines 28 are included on the memory cell field effect transistor isolation region 12a.

A silicide layer 26 is included on the peripheral circuit transistor source and drain regions 32b/34b, on the peripheral circuit gates 14b, on the memory cell transistor gates 14a and on the bit lines 28. The memory cell transistor source and drain regions 32a/34a are free of the silicide layer 26 thereon. Accordingly, the silicide layer 26 may reduce the contact resistance of the memory cell transistor gates 14a and the bit lines 28 without unduly increasing the leakage current in the memory cell source and drain regions 32a/34a. Accordingly, the refresh characteristics and/or the reliability of the memory cell array need not degrade.

Accordingly, a silicide layer can be formed selectively in certain portions of a memory array to thereby allow reduced contact resistance where desired without the need to unduly increase leakage current and thereby degrade the refresh characteristics of the memory array. High performance and/or high reliability integrated circuit memory devices may thereby be provided.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating an integrated circuit memory device comprising the steps of:

fabricating an array of memory cell field effect transistors and a plurality of peripheral circuit field effect transistors that are spaced-apart from the array of memory cell transistors in an integrated circuit substrate, the memory cell transistors comprising spaced-apart memory cell transistor source and drain regions and a memory cell gate therebetween, the peripheral circuit transistors comprising spaced-apart peripheral circuit transistor source and drain regions and a peripheral circuit gate therebetween;

forming a silicide blocking layer on the memory cell transistor source and drain regions; and siliciding the integrated circuit substrate to thereby form a silicide layer on the memory cell gates, on the peripheral circuit source and drain regions and on the peripheral circuit gates, such that the memory cell transistor source and drain regions are free of the silicide layer thereon.

2. A method according to claim 1 wherein the step of forming a silicide blocking layer comprises the steps of:

forming a blanket silicide blocking layer on the integrated circuit substrate including on the spaced-apart memory cell transistor source and drain regions, on the memory cell gates, on the spaced-apart peripheral circuit transistor source and drain regions and on the peripheral circuit gates; and etching the blanket silicide blocking layer on the memory cell gates, on the spaced-apart peripheral circuit transistor source and drain regions and on the peripheral circuit gates.

3. A method according to claim 1 wherein the step of forming a silicide blocking layer comprises the step of:

forming a silicide blocking layer on the memory cell transistor source and drain regions, such that the memory cell gates, the spaced-apart peripheral circuit transistor source and drain regions and the peripheral circuit gates are free of the silicide blocking layer.

4. A method according to claim 1 wherein the step of forming a silicide blocking layer comprises the step of:

forming a silicide blocking layer comprising an insulating layer and an antireflective coating on the memory cell transistor source and drain regions.

5. A method according to claim 4 wherein the insulating layer comprises at least one of high temperature oxide and low temperature oxide.

6. A method according to claim 2:

wherein the step of forming a blanket silicide blocking layer comprises the steps of:

forming a blanket insulating layer on the integrated circuit substrate including on the spaced-apart memory cell transistor source and drain regions, on the memory cell gates, on the spaced-apart peripheral circuit transistor source and drain regions and on the peripheral circuit gates; and forming an antireflective coating on the blanket insulating layer; and wherein the step of etching the blanket silicide blocking layer comprises the steps of:

forming a patterned photoresist layer on the antireflective coating that exposes the antireflective coating on the memory cell gates, on the spaced-apart peripheral circuit transistor source and drain regions and on the peripheral circuit gates;

dry etching the blanket silicide blocking layer and a portion of the insulating layer on the memory cell gates, on the spaced-apart peripheral circuit transistor source and drain regions and on the peripheral circuit gates, using the patterned photoresist layer as an etch mask;

wet etching the remaining portion of the insulating layer on the memory cell gates, on the spaced-apart peripheral circuit transistor source and drain regions and on the peripheral circuit gates, using the patterned photoresist layer as an etch mask; and removing the patterned photoresist layer.

7. A method according to claim 6 wherein the step of removing the photoresist is followed by the step of:

removing the antireflective coating.

8. A method according to claim 1 wherein the siliciding step comprises the steps of:

blanket forming a refractory metal layer on the integrated circuit substrate including on the silicide blocking layer, on the memory cell transistor gates, on the peripheral circuit source and drain regions and on the peripheral circuit gates; and heating to react the refractory metal layer with the memory cell transistor gates, the peripheral circuit source and drain regions and the peripheral circuit gates, to thereby form the silicide layer on the memory cell transistor gates, on the peripheral circuit source and drain regions and on the peripheral circuit gates, and the refractory metal layer on the silicide blocking layer on the memory cell transistor source and drain regions remains unreacted.

9. A method according to claim 8 wherein the heating step is followed by the step of removing the unreacted refractory metal layer.

10. A method according to claim 1 wherein the peripheral circuit transistors comprise a control circuit for the array of memory cell transistors.

11. A method according to claim 1 wherein the integrated circuit memory device is a Merged Memory and Logic (MML) integrated circuit device including the array of memory cell transistors and a logic block that communicates with the array of memory cell transistors, the peripheral circuit transistors comprising the logic block.

12. A method according to claim 1:

wherein the step of fabricating comprises the step of fabricating an array of memory cell field effect transistors, a memory cell field effect transistor isolation region that isolates the memory cell field effect transistors from one another, a plurality of bit lines on the memory cell field effect transistor isolation region and a plurality of peripheral circuit field effect transistors that are spaced-apart from the array of memory cell transistors, in an integrated circuit substrate, the memory cell transistors comprising spaced-apart memory cell transistor source and drain regions and a memory cell gate therebetween, the peripheral circuit transistors comprising spaced-apart peripheral circuit transistor source and drain regions and a peripheral circuit gate therebetween; and wherein the siliciding step comprises the step of siliciding the integrated circuit substrate to thereby form a silicide layer on the memory cell transistor gates, on the plurality of bit lines, on the peripheral circuit source and drain regions and on the peripheral circuit gates, such that the memory cell transistor source and drain regions are free of the silicide layer.

* * * * *